United States Patent
Snyder et al.

(10) Patent No.: US 11,276,641 B1
(45) Date of Patent: Mar. 15, 2022

(54) CONFORMAL MULTI-PLANE MATERIAL DEPOSITION

(71) Applicant: Rockwell Collins, Inc., Cedar Rapids, IA (US)

(72) Inventors: Kyle B. Snyder, Marion, IA (US); Nathaniel P. Wyckoff, Marion, IA (US); Brandon C. Hamilton, Marion, IA (US); Bret W. Simon, West Liberty, IA (US); Alexander Warren, Yorkville, IL (US)

(73) Assignee: Rockwell Collins, Inc., Ceder Rapids, IA (US)

( * ) Notice: Subject to any disclaimer, the term of this patent is extended or adjusted under 35 U.S.C. 154(b) by 55 days.

(21) Appl. No.: 16/735,432

(22) Filed: Jan. 6, 2020

(51) Int. Cl.
- *H01L 21/00* (2006.01)
- *H01L 23/528* (2006.01)
- *H01L 21/285* (2006.01)

(52) U.S. Cl.
CPC ...... *H01L 23/528* (2013.01); *H01L 21/28562* (2013.01)

(58) Field of Classification Search
CPC .......... H01L 23/528; H01L 21/28562
See application file for complete search history.

(56) References Cited

U.S. PATENT DOCUMENTS

| | | | |
|---|---|---|---|
| RE29,284 E * | 6/1977 | Shaheen | C25D 5/02 205/125 |
| 4,231,051 A * | 10/1980 | Custode | H01L 21/28525 257/387 |
| 4,277,881 A * | 7/1981 | Godejahn, Jr. | H01L 21/32105 438/287 |
| 4,574,331 A | 3/1986 | Smolley | |
| 4,800,840 A * | 1/1989 | Colton | C23C 14/042 118/504 |
| 5,147,740 A * | 9/1992 | Robinson | G03F 7/094 257/E21.025 |
| 7,141,875 B2 | 11/2006 | Hsuan et al. | |
| 8,461,698 B1 * | 6/2013 | Hamilton | H01L 21/563 257/787 |
| 9,165,899 B2 | 10/2015 | Joh | |
| 9,257,358 B2 * | 2/2016 | Liu | H01L 25/0652 |
| 2005/0184376 A1 | 8/2005 | Salmon | |
| 2006/0186543 A1 * | 8/2006 | Rowell | H01L 21/76885 257/741 |

FOREIGN PATENT DOCUMENTS

WO 2018182754 A1 10/2018

* cited by examiner

*Primary Examiner* — Laura M Menz

(74) *Attorney, Agent, or Firm* — Suiter Swantz pc llo

(57) ABSTRACT

An electronic device fabrication system may include, but is not limited to: a conductive material deposition device configured for deposition of a conductive material; at least one electronic device substrate configured to receive deposited conductive material; and at least one mask configured to selectively transmit the conductive material to the electronic device substrate, wherein the at least one mask configured to selectively transmit the conductive material to the electronic device substrate includes: at least a first side disposed at an angle relative to an adjacent second side.

11 Claims, 7 Drawing Sheets

CONFORMAL MULTI-PLANE MATERIAL DEPOSITION

BACKGROUND

In order to route signals between electrical circuit dies, chips, or laminate board levels in a z-direction, through-silicon vias may be employed. However, such vias may have both structural (e.g. height) and design/fabrication limitations as the sizing/positioning of such vias must be highly integrated into the chip design from an early stage. As such, use of silicon vias limits the flexibility of signal routing.

SUMMARY

An electronic device fabrication system may include, but is not limited to: a conductive material deposition device configured for deposition of a conductive material; at least one electronic device substrate configured to receive deposited conductive material; and at least one mask configured to selectively transmit the conductive material to the electronic device substrate, wherein the at least one mask configured to selectively transmit the conductive material to the electronic device substrate includes: at least a first side disposed at an angle relative to an adjacent second side.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings. Referring generally to FIGS. 1 through 11, embodiments of the present disclosure are generally directed to a multi-plane material deposition system 100 for fabrication of electronic circuitry on an electronic device substrate 101 (e.g. silicon die, laminate circuit board, chip, and the like).

The methods and systems described herein allow for a level of adaptability as to where z-direction interconnects may be positioned such that circuitry artwork design and positioning may be modified to account for on-the-fly changes to on-device component (e.g. memory, processor, etc.) or interface (e.g. interconnect positioning) changes. Specifically, the methods and systems described herein allow for the adaptation of commercial-off-the-shelf (COTS) devices to include z-direction interconnects without redesign or modification of the original COTS device.

Figure 1:
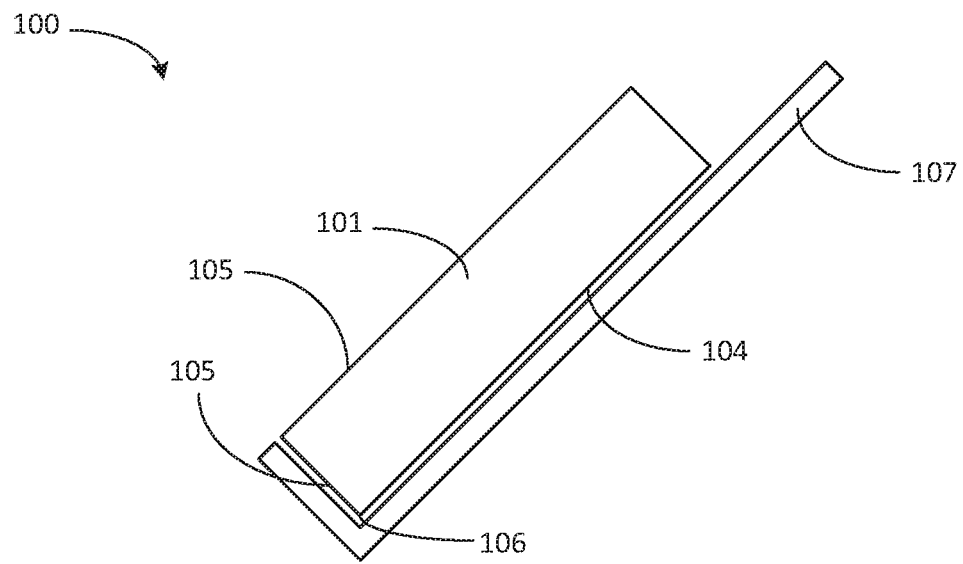
FIG. 1 shows a multi-plane material deposition system.
Figure 1:
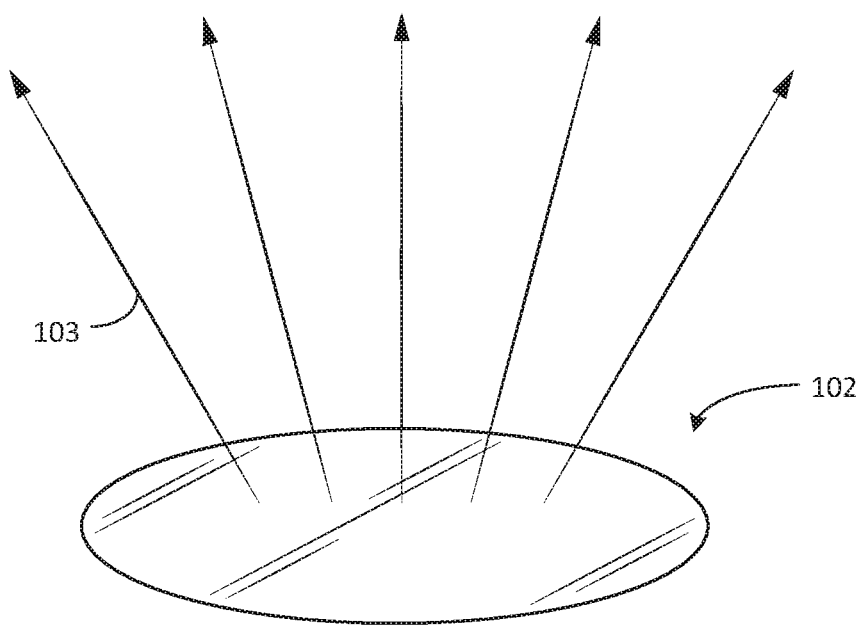

Referring to FIG. 1, a multi-plane material deposition system 100 is shown. The multi-plane material deposition system 100 may include a vapor deposition system 102 configured to deposit a conductive material 103 on a surface of an electronic device substrate 101 to form a conductive thin-film coating to generate one or more circuitry components (e.g. electrical interconnects between components of the electronic device substrate 101). For example, the vapor deposition system 102 may be a thin film deposition system (e.g. electron beam (e-beam) physical vapor deposition (PVD), sputtering, resistive PVD, pulsed laser depositing, and the like).

In order to transmit a signal from a first surface 104 of the electronic device substrate 101 (e.g. a bottom surface) to a second surface 105 (e.g. a side or top surface), thin-film coating circuitry components must be disposed on both the first surface 104 and second surface 105 necessitating circuitry printing around a corner 106 of the electronic device substrate 101. To facilitate such multi-surface printing, a mask 107 may be employed to specify the location of the deposition of the conductive material 103 on one or more surfaces of the electronic device substrate 101.

Figure 2:
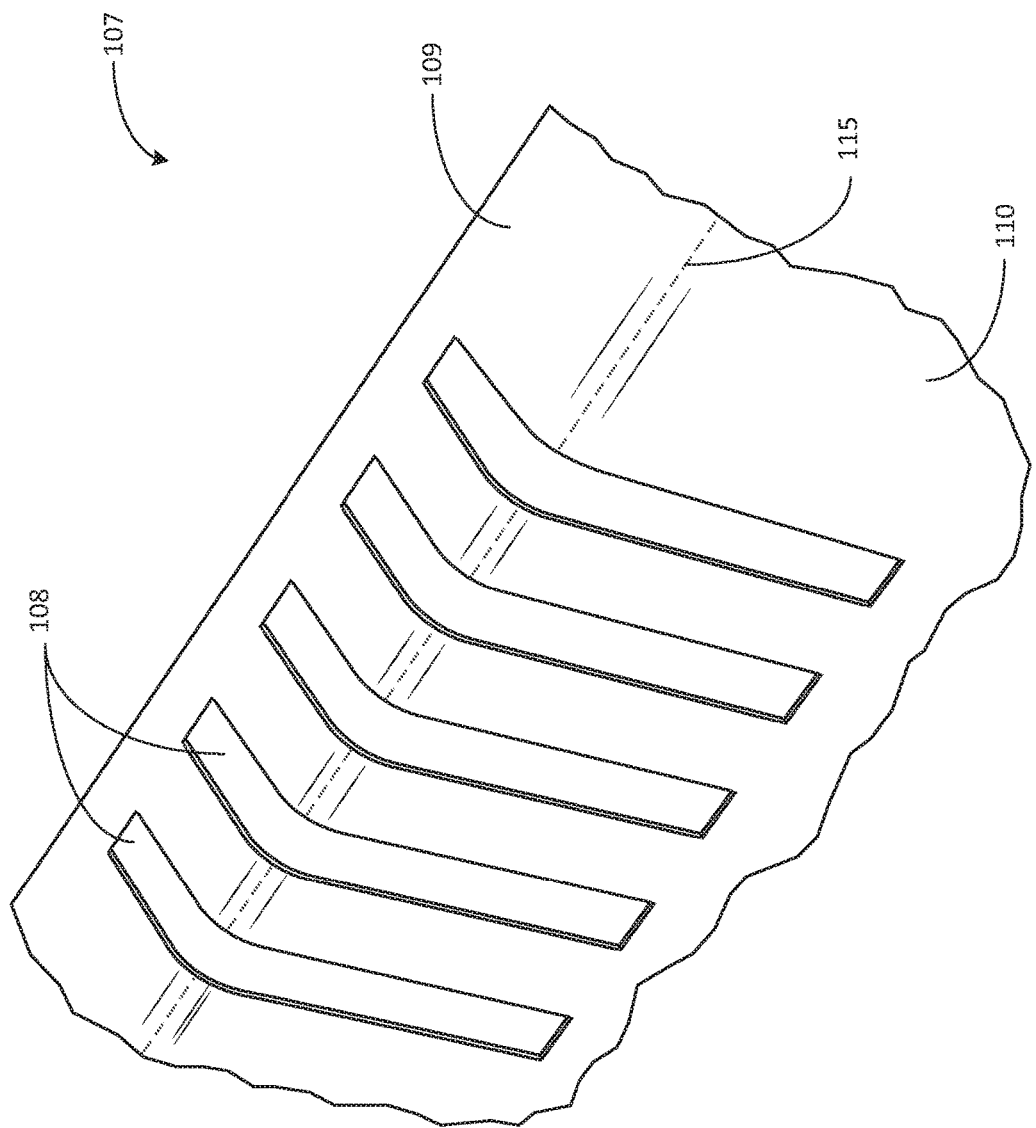
FIG. 2 shows a material deposition mask.

Referring to FIG. 2, a mask 107 may include one or more apertures 108 through which the conductive material 103 may pass and be deposited on a surface of the electronic device substrate 101 (e.g. a surface pre-coated with a non-conductive layer such as a dielectric). Specifically, the mask 107 may include at least a first side 109 and a second side 110. The apertures 108 may be continuously formed in the first side 109 and the second side 110 such that an aperture 108 spans at least a portion of both the first side 109 and the second side 110. The first side 109 and the second side 110 of the mask 107 may be configured at an angle relative to one another (e.g. 90 degrees) such that the first side 109 and the second side 110 conform to the first surface 104 and the second surface 105, respectively, of the electronic device substrate 101. Alternately, the first side 109 and the second side 110 of the mask 107 may be configured to have a radiused or chamfered relation.

In one embodiment, as shown in FIG. 1, a multi-step deposition process may be employed. The electronic device substrate 101 may be disposed within the mask 107 such that the desired locations on the electronic device substrate 101 for the thin-film coating circuitry components are exposed to the conductive material 103 via the apertures 108. Due to the angled configuration of the mask 107, thin-film coating circuitry components may be printed simultaneously on both the first surface 104 (e.g. the bottom) and the second surface 105 (e.g. the side) of the electronic device substrate 101. In this embodiment, in order to fabricate cooperating thin-film coating circuitry components on a third surface 111 (e.g. the top), the electronic device substrate 101 may be repositioned (e.g. flipped) within the mask 107 or disposed within a second mask and a second thin-film deposition may be applied so as to at least partially overlap with the thin-film coating circuitry components previously fabricated on the first surface 104 and the second surface 105 to create a completed edge-wrap circuitry connection 112. To facilitate the respective positioning of the electronic device substrate 101 within the mask 107 (or a set of masks), the mask 107 may include one or more registration tabs (e.g. a laser etched tab) or other alignment aids to direct the positioning of the electronic device substrate 101 within the mask 107 to ensure proper overlap of cooperating thin-film coating circuitry components on the first surface 104, second surface 105 and third surface 111 of the electronic device substrate 101.

Figure 3:
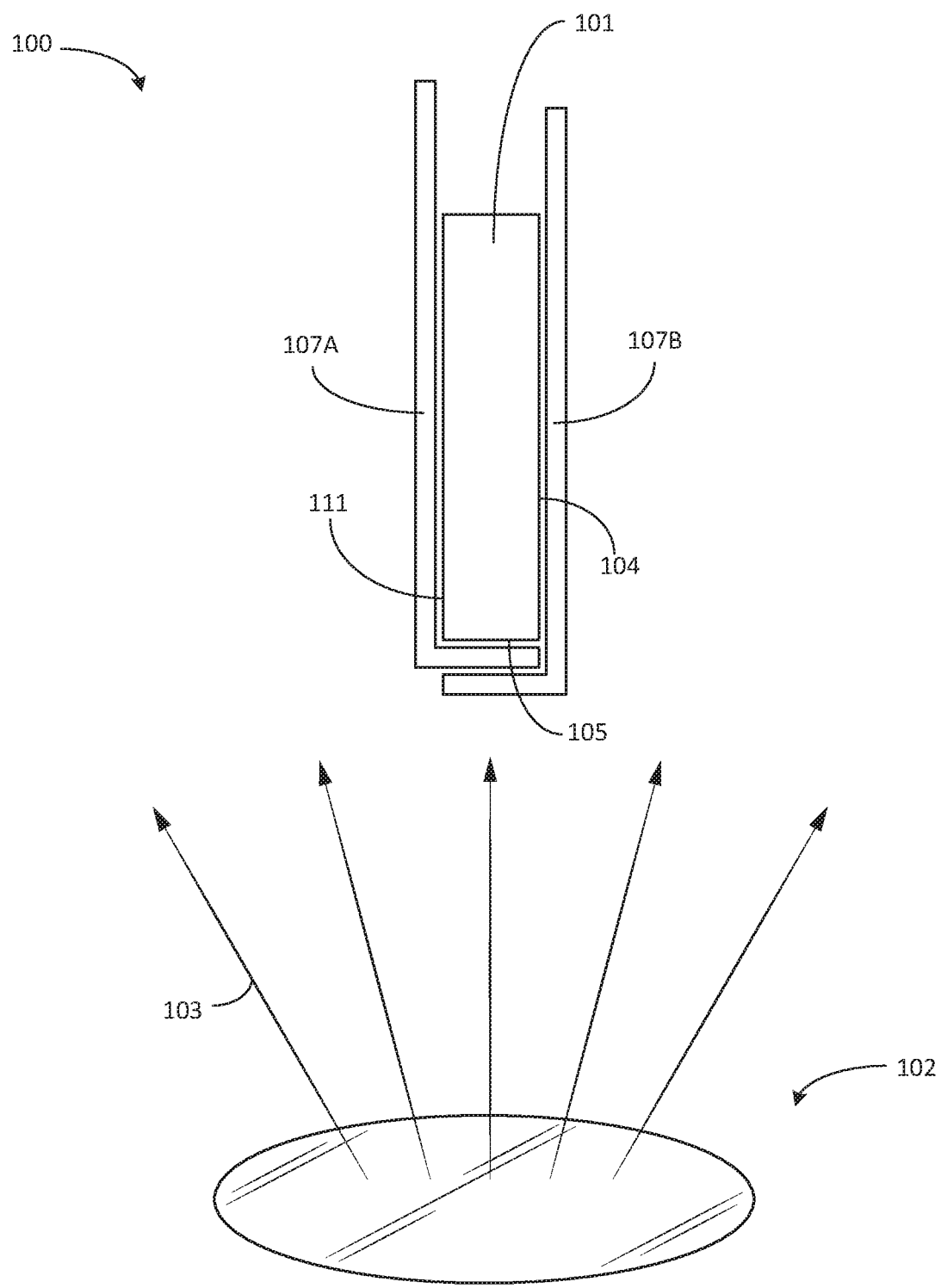
FIG. 3 shows multi-plane material deposition system.

In another embodiment, as shown in FIG. 3, a single-step deposition process may be employed. A set of masks including at least a first mask 107A and a second mask 107. The first mask 107A and the second mask 107 may include co-aligned apertures 108 such that they cooperatively expose the first surface 104, the second surface 105, and third surface 111 of the electronic device substrate 101. Rotation of the first mask 107A, second mask 107, and electronic device substrate 101 relative to the vapor deposition system 102 allows for the deposition of the conductive material 103 onto the electronic device substrate 101 to form an instance of the edge-wrap circuitry connection 112. As such, the deposition of the conductive material 103 may be completed in a single step thereby negating the need to reposition and/or reregister the electronic device substrate 101 relative to a mask 107. However, registration of the first mask 107A and the second mask 107 may be required to ensure their proper relative alignment. Such registration may again be accomplished by laser etching one or more registration tabs into the first mask 107A and the second mask 107.

Alternately, the cooperating apertures 108 of the first mask 107A and the second mask 107 may be integrated into a single, three-sided mask such that a single aperture 108 may provide for simultaneous exposure of three sides of the electronic device substrate 101 to the conductive material 103.

Figure 4:
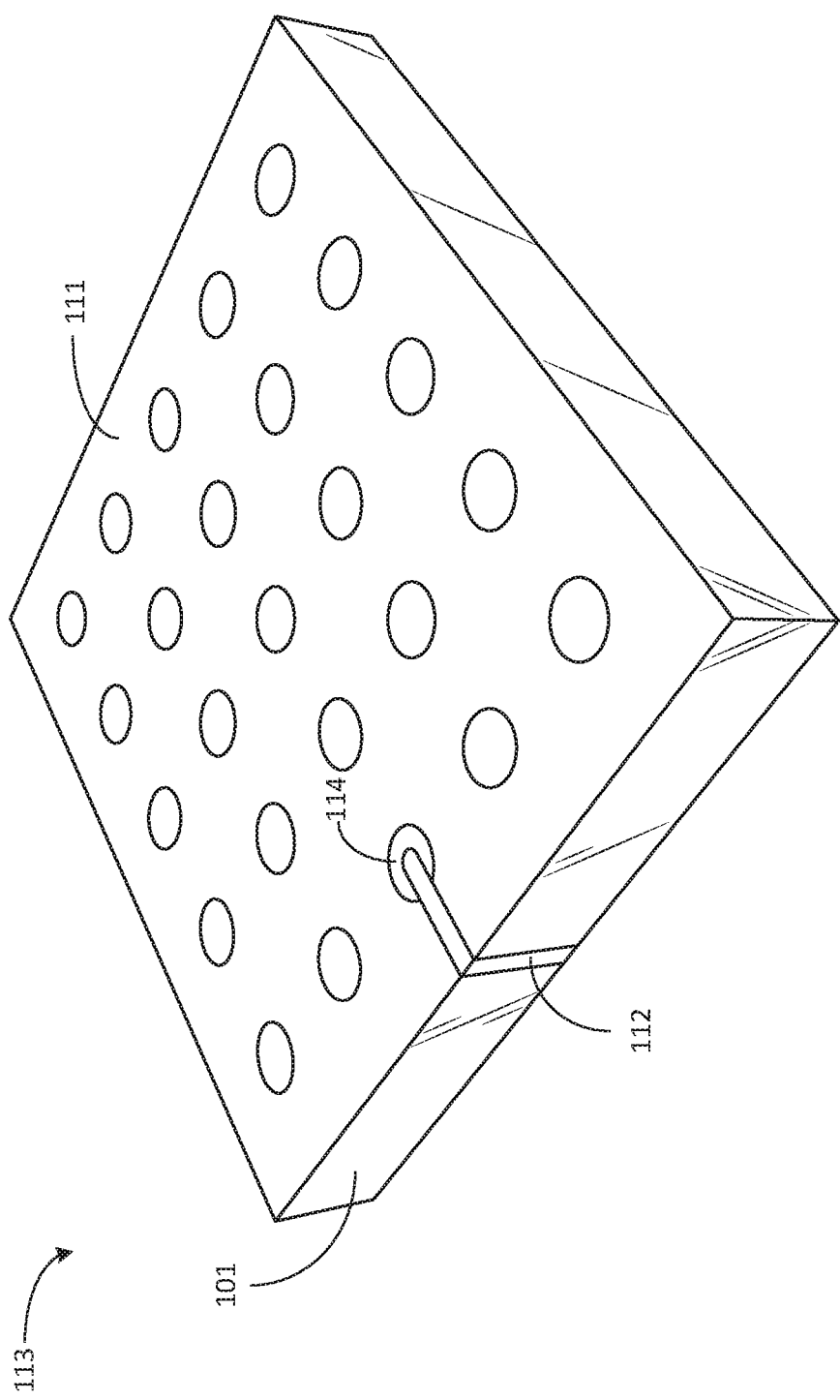
FIG. 4 shows an electronic device including an edge-wrap interconnect.
Figure 5:
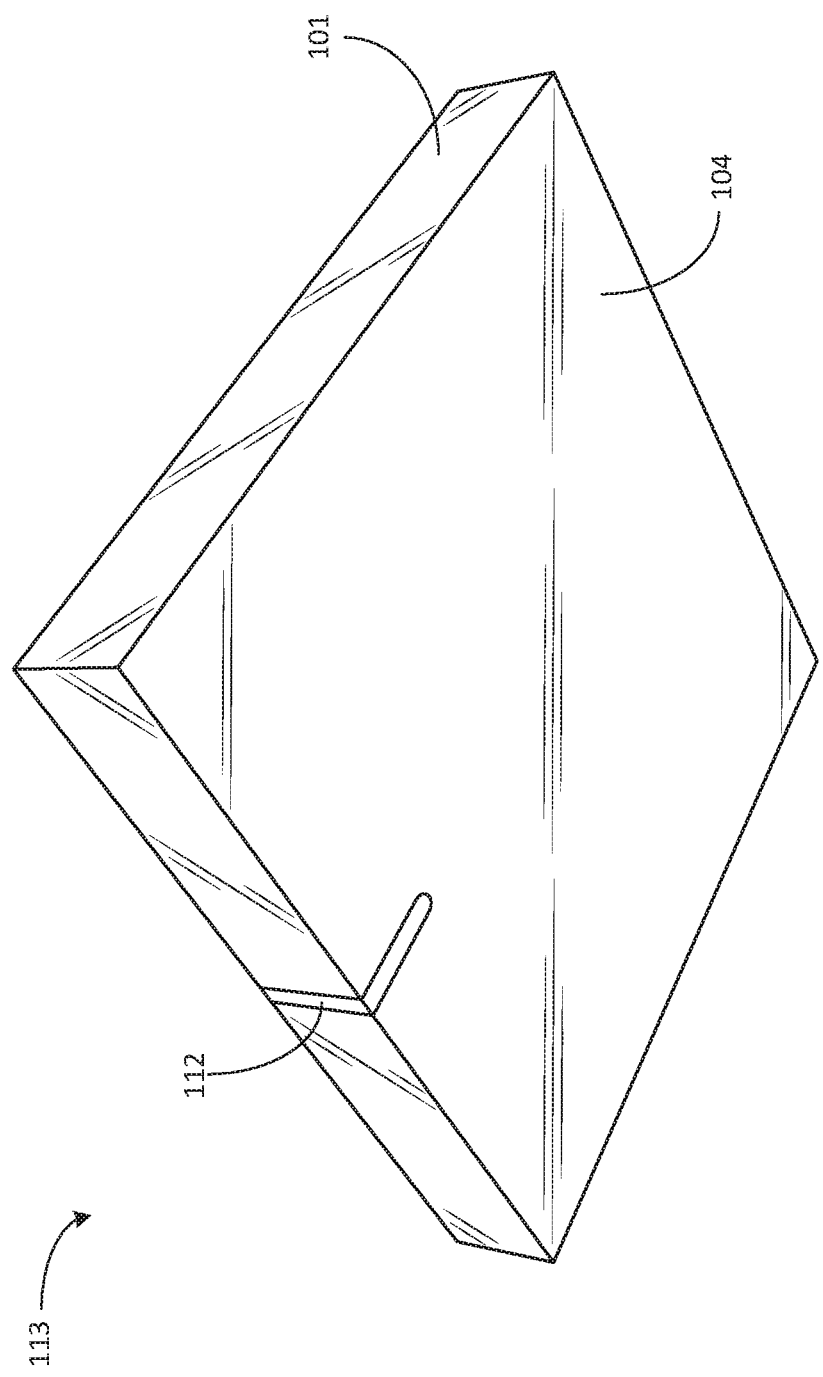
FIG. 5 shows an electronic device including an edge-wrap interconnect.

Referring to FIGS. 4 and 5, following either the multi-step deposition process of FIG. 1 or the single-step process of FIG. 3 as described above, a resultant electronic device 113 is produced. The electronic device 113 includes the edge-wrap circuitry connection 112 linking a connection point 114 (e.g. a pin port) for connection to an electronic component (e.g. a memory or processor chip) on the third surface 111 of the electronic device substrate 101 to a location on the first surface 104 of the electronic device substrate 101.

Referring again to FIG. 2, the mask 107 may be configured via laser etching. For example, the mask 107 may be disposed in a planar configuration and then the apertures 108 may be laser cut into the mask 107. Alternately, the mask 107 may be fabricated via electroplating.

Following formation of the apertures 108 in the mask 107, one or more portions of the mask 107 may be bent to an angle (e.g. 90 degrees) conforming to the an edge shape of the electronic device substrate 101 to form the first side 109 and the second side 110 of the mask 107. To facilitate the bending of the portions of the mask 107 to form the first side 109 and the second side 110 of the mask 107, a half-etch line 115 (e.g. a laser etch, chemical etch, and the like) may be formed along a desired bend line in mask 107 to ensure formation of a sharp edge.

Referring to FIGS. 6-11, various configurations of the edge-wrap circuitry connection 112 are shown.

Figure 6:
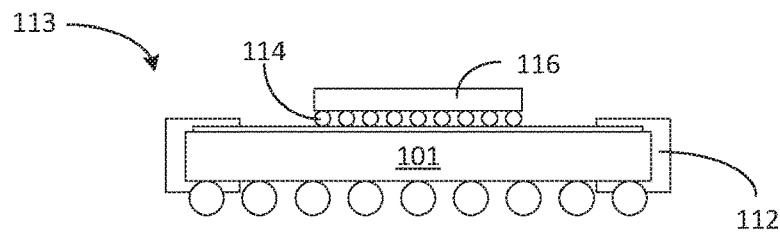
FIG. 6 shows an electronic device including an edge-wrap interconnect.
Figure 7:
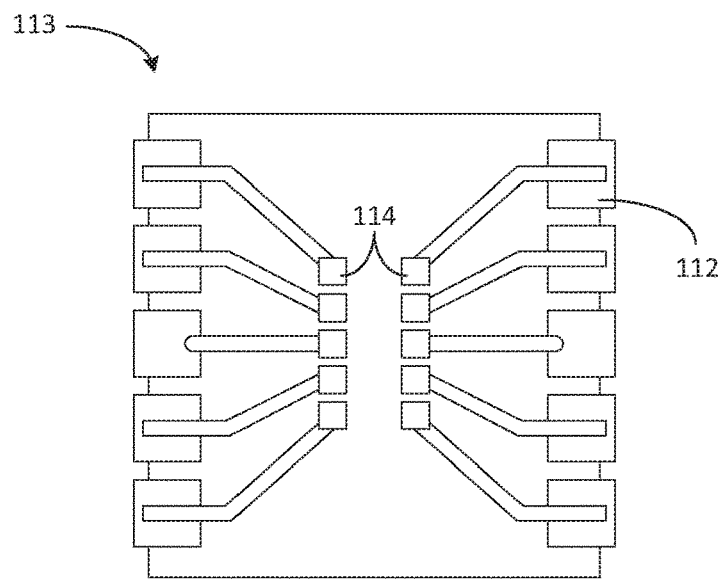
FIG. 7 shows an electronic device including an edge-wrap interconnect.
Figure 8:
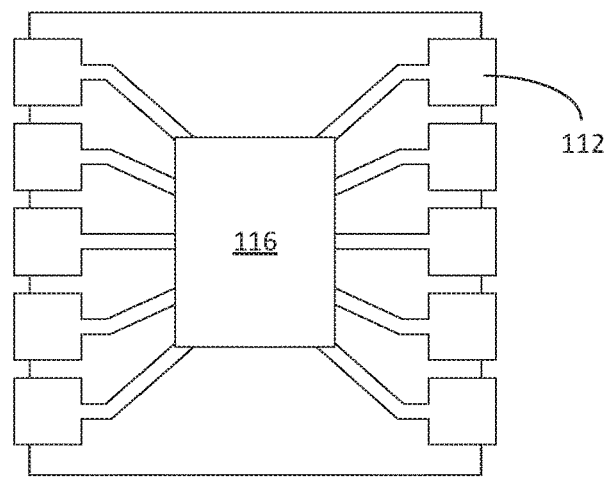
FIG. 8 shows an electronic device including an edge-wrap interconnect.

Referring to FIGS. 6-8, a die-scale electronic component 116 (e.g. a memory, processor, and the like) on a top side of an electronic device 113 may be connected, via at least one connection point 114 and at least one edge-wrap circuitry connection 112, to one or more electronic connections on a bottom side of the electronic device 113.

Figure 9:
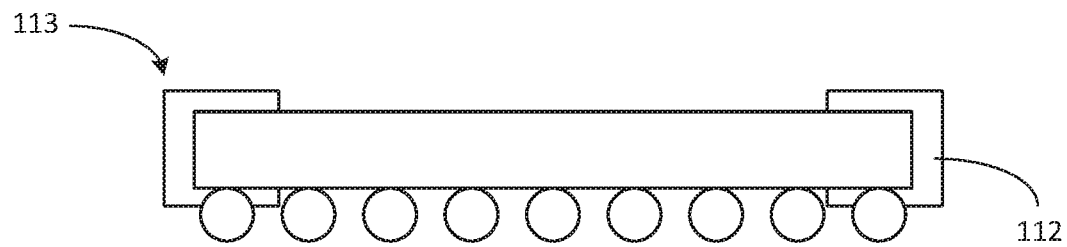
FIG. 9 shows an electronic device including an edge-wrap interconnect.
Figure 10:
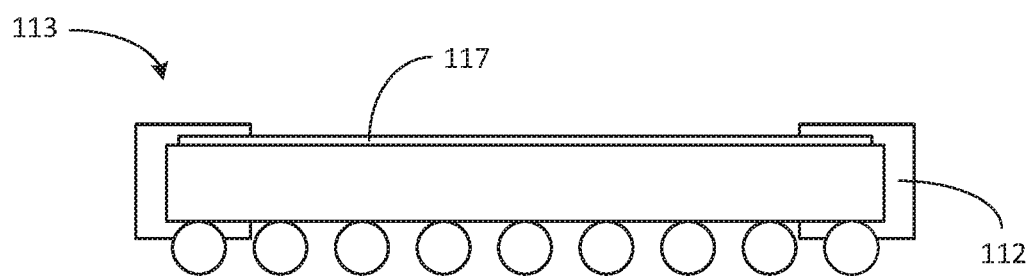
FIG. 10 shows an electronic device including an edge-wrap interconnect.
Figure 11:
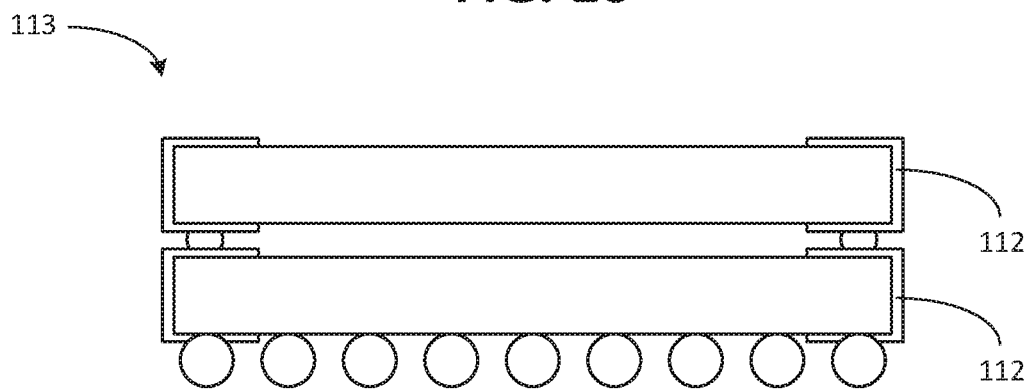
FIG. 11 shows an electronic device including an edge-wrap interconnect.

Referring to FIGS. 9-11, various interconnection schemes employing an edge-wrap circuitry connection 112 are show. FIG. 9 shows a basic edge-wrap circuitry connection 112. FIG. 10 shows an edge-wrap circuitry connection 112 with surface redistribution (as in FIGS. 6-8) via circuitry 117 on a top surface of the electronic device 113. FIG. 11 shows part-to-part stacked interconnection via edge-wrap circuitry connection 112.

While described above in the context of fabricating electronic interconnects between the first surface 104, second surface 105, and third surface 111 of the electronic device 113, such methodologies may be employed for the fabrication of additional electronic structures which include the edge-wrap circuitry connection 112. For example, electromagnetic shielding (e.g. a Faraday cage), or printed antenna structures may benefit from the employment of deposition of an edge-wrap circuitry connection 112 on an electronic device substrate 101 as described above. In such cases, the edge-wrap circuitry connection 112 may extend only partially along the second surface 105 with connection to electronic elements on either the first surface 104 or the third surface 111.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An electronic device fabrication system comprising:
a conductive material deposition device configured for deposition of a conductive material;
an electronic device substrate configured to receive deposited conductive material, wherein the electronic device substrate comprises a first surface and a second surface adjacent to the first surface; and
at least one mask configured to selectively transmit the conductive material to the first surface and the second surface of the electronic device substrate, wherein the at least one mask includes:
a first side disposed at a nonzero angle relative to an adjacent second side; and
a continuous aperture that spans at least a portion of the first side and a portion of the second side and is configured to selectively transmit the conductive material to the first surface and the second surface,
wherein the first side of the at least one mask conforms to the first surface of the electronic device substrate, and the second side of the at least one mask conforms to the second surface of the electronic device substrate.

2. The electronic device fabrication system of claim 1, wherein the conductive material deposition device includes:
a thin-film deposition device.

3. The electronic device fabrication system of claim 2, wherein the at least one electronic device substrate configured to receive deposited conductive material includes:
at least a silicon die.

4. The electronic device fabrication system of claim 1, wherein the at least one mask is configured to transmit the conductive material to a portion of each of the first surface and the second surface of the electronic device substrate as a continuous edge-wrap circuitry connection.

5. The electronic device fabrication system of claim 4, wherein the at least one mask is at least two masks, wherein at least two of the at least two masks have alignment aids to direct the positioning of the electronic device substrate within the at least two masks to ensure proper overlap of the conductive material.

6. The electronic device fabrication system of claim 1, wherein the nonzero angle is 90 degrees.

7. The electronic device fabrication system of claim 4, wherein the first side disposed at an angle relative to an adjacent second side includes:
at least a first side disposed at an angle relative to an adjacent second side via at least one of a radiused corner or a chamfered corner.

8. The electronic device fabrication system of claim 5, wherein the at least one mask includes:

a first mask including at least one first aperture configured to allow conductive material to be deposited on the at least one electronic device substrate; and a second mask, in registration with the first mask, including at least one second aperture configured to allow conductive material to be deposited on the at least one electronic device substrate.

9. The electronic device fabrication system of claim 8, wherein the at least one first aperture is at least partially co-aligned with the at least one second aperture when the first mask is in registration with the second mask.

10. The electronic device fabrication system of claim 9, wherein, when the at least one first aperture is at least partially co-aligned with the at least one second aperture, the at least one first aperture and the at least one second aperture cooperatively form a common aperture configured to expose the first surface, the second surface, and a third surface of the electronic device substrate to the conductive material.

11. The electronic device fabrication system of claim 1, wherein the at least one electronic device substrate includes:

at least one electronic device substrate having at least one dielectric layer configured to receive the deposited conductive material.

\* \* \* \* \*